(12) United States Patent
Higgins, III

(10) Patent No.: US 9,685,351 B2
(45) Date of Patent: Jun. 20, 2017

(54) WIRE BOND MOLD LOCK METHOD AND STRUCTURE

(71) Applicant: Leo M. Higgins, III, Austin, TX (US)

(72) Inventor: Leo M. Higgins, III, Austin, TX (US)

(73) Assignee: NXP USA, INC., Austin, TX (US)

( * ) Notice: Subject to any disclaimer, the term of this patent is extended or adjusted under 35 U.S.C. 154(b) by 1 day.

(21) Appl. No.: 14/335,366

(22) Filed: Jul. 18, 2014

(65) Prior Publication Data

US 2016/0020182 A1 Jan. 21, 2016

(51) Int. Cl.
*H01L 21/48* (2006.01)
*H01L 23/495* (2006.01)
*H01L 23/31* (2006.01)
*H01L 23/00* (2006.01)

(52) U.S. Cl.
CPC ...... *H01L 21/4889* (2013.01); *H01L 23/3142* (2013.01); *H01L 23/49503* (2013.01); *H01L 23/49541* (2013.01); *H01L 23/3107* (2013.01); *H01L 23/49551* (2013.01); *H01L 24/29* (2013.01); *H01L 24/32* (2013.01); *H01L 24/45* (2013.01); *H01L 24/48* (2013.01); *H01L 2224/291* (2013.01); *H01L 2224/293* (2013.01); *H01L 2224/2919* (2013.01); *H01L 2224/29144* (2013.01); *H01L 2224/29188* (2013.01); *H01L 2224/29294* (2013.01); *H01L 2224/32245* (2013.01); *H01L 2224/45144* (2013.01); *H01L 2224/48247* (2013.01); *H01L 2224/83101* (2013.01); *H01L 2224/83444* (2013.01); *H01L 2924/181* (2013.01); *H01L 2924/18301* (2013.01); *H01L 2924/19107* (2013.01)

(58) Field of Classification Search
CPC ..... H01L 21/48; H01L 21/4889; H01L 21/00; H01L 24/28; H01L 24/31; H01L 24/47; H01L 2224/48091; H01L 2224/291; H01L 2224/29144; H01L 2224/29188; H01L 2924/14
USPC .................. 257/676, 666, 674, 670; 438/123
See application file for complete search history.

(56) References Cited

U.S. PATENT DOCUMENTS

| | | | |
|---|---|---|---|
| 7,091,602 B2 | 8/2006 | Elliott et al. | |
| 7,750,486 B2 | 7/2010 | Ohta | |
| 7,808,089 B2 | 10/2010 | Nguyen et al. | |
| 7,977,773 B1 | 7/2011 | Cusack | |
| 2003/0122224 A1* | 7/2003 | Shih et al. | 257/676 |
| 2007/0267731 A1 | 11/2007 | Punzalan et al. | |
| 2008/0131294 A1* | 6/2008 | Koehl | 417/53 |

(Continued)

FOREIGN PATENT DOCUMENTS

EP 0687008 A2 12/1995

OTHER PUBLICATIONS

Coors Tek, Inc., Gaiser Precision Bonding Tools, Wedge Bonding, Nov. 28, 2007.

(Continued)

*Primary Examiner* — Chuong A Luu

(57) ABSTRACT

A method and apparatus are described for fabricating a microchip structure (70) which protects interior electrical integrated circuits and components (120) attached to a lead frame die flag (104) using a molding compound (124) that mechanically interlocks with one or more positive mold lock structures formed as dummy wire loops (114) or stud bumps (214) that are attached to the lead frame (100) and/or die flag (104).

9 Claims, 5 Drawing Sheets

(56) References Cited

U.S. PATENT DOCUMENTS

2009/0224381 A1 9/2009 Ishihara et al.
2011/0027943 A1 2/2011 Gurrum et al.

OTHER PUBLICATIONS

P. Adamson, International Rectifier, Lead-Free Packaging for Discrete Power Semiconductors, JEDEC Conference, Apr./May 2002.

* cited by examiner

WIRE BOND MOLD LOCK METHOD AND STRUCTURE

BACKGROUND OF THE INVENTION

Field of the Invention

The present invention is directed in general to the field of packaged integrated circuit devices. In one aspect, the present invention relates to an improved packaging scheme for producing integrated circuits with reduced delamination.

Description of the Related Art

Microchips are formed from a variety of dissimilar materials. A semiconductor die, formed from silicon, gallium arsenide, germanium, or some other semiconductor material, may be attached to the flag portion of a lead frame and/or heatsink which may be formed with copper or some other thermally conductive material. The semiconductor die is bonded to the die flag with an adhesive material or structure, such as a die bond soldering compound. In selected Quad Flat No-Lead (QFN) packages, the lead frame includes a series of lead contacts that serve as the output electrical contacts for the microchip. To electrically couple the semiconductor die to the lead frame, metal wires extend between the semiconductor die and the lead contacts. To protect the semiconductor die, wires, and lead contacts, a plastic mold compound encapsulates the semiconductor package.

A common problem with integrated circuit packages, such as power QFN (PQFN) and small outline integrated circuit (SOIC) power packages, is delamination of the mold compound from the region surrounding the die on the die attach flag(s), and other lead frame regions. This problem is particularly acute with SOICs that use certain types of organic polymer-based die attach adhesives due to the bleed of liquid material from the die attach adhesive onto the surface of the flag surrounding the die. Delamination also occurs with PQFN packages which use solder die attach for the high power die. Mold compound delamination often leads to electrical problems due to variation in the drain-source on-state resistance (Rdson) and compensation series resistance (CSR), and can also result in separation in the die attach region (die to solder, die to organic polymer adhesive, solder or adhesive to lead frame) in portions of the die attach interface. While the previous descriptions refer to lead frame-based packages, delamination of the encapsulation material from conductor regions on the surface of a printed circuit board-based (PCB) package, also referred to as an organic package, may also be a problem.

BRIEF DESCRIPTION OF THE DRAWINGS

The present invention may be understood, and its numerous objects, features and advantages obtained, when the following detailed description is considered in conjunction with the following drawings.

DETAILED DESCRIPTION

A method and apparatus are described for fabricating and packaging one or more integrated circuit die by forming a mechanical mold locking feature on a lead frame assembly and/or die flag, or on similar metal features on a printed circuit board-based (PCB) substrate assembly, to eliminate or reduce delamination between the lead frame or PCB substrate and the mold compound encapsulation. In selected embodiments, the mechanical mold locking feature is formed with one or more raised structures extending above the lead frame assembly and/or die flag, or the PCB substrate assembly, and protruding laterally to provide a mechanical engagement surface to securely lock the encapsulation package to the lead frame or PCB substrate assembly. Examples of such mechanical mold locking features include wire wedge bond loops or chains, stud bumps or other protruding structures having a raised and laterally protruding feature formed over the lead frame or PCB substrate. With the protruding mechanical mold locking features formed on the lead frame assembly, the top of each integrated circuit die may be covered with a molding compound using any desired packaging scheme, including but not limited to QFN (Quad Flat No leads), SOIC (Small-Outline Integrated Circuit), QFP (Quad Flat Package), BGA (Ball Grid Array), or LGA (Land Grid Array) packaging. As will be appreciated, the application of the mold compound will mechanically engage and lock with the protruding mechanical mold locking features to increase adhesion to the mold compound and thereby reduce and/or prevent delamination.

Figure 1:
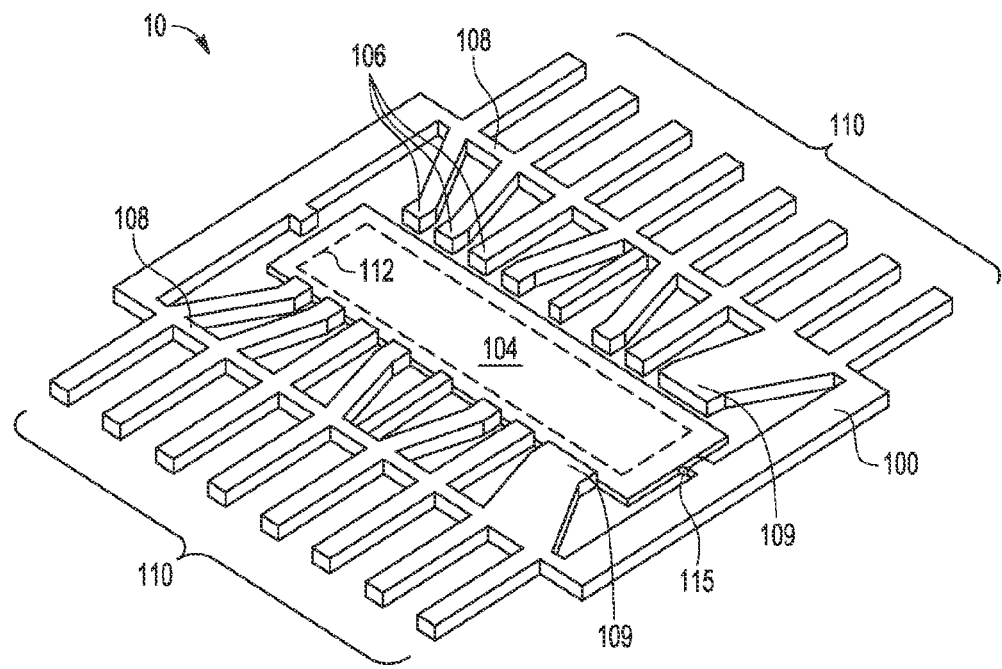
FIG. 1 is an isometric top view of an example lead frame having a die flag that is suitable for use in conjunction with selected embodiments of the present invention.

To illustrate an example fabrication sequence for packaging one or more integrated circuit devices, reference is now made to FIG. 1 which provides an isometric top view 10 of an example lead frame 100 having a die flag 104 that is suitable for use in conjunction with selected embodiments of the present invention. As will be appreciated, the lead frame 100 and die flag 104 may be produced by stamping or etching a portion of a metal (e.g., copper or copper alloy) strip with a predetermined pattern of lead frame features (e.g., die attach flags, interior electrical contacts, exterior electrical contacts, etc.). In selected embodiments, the exposed die flag 104 of the copper lead frame may be plated on at least the exterior surface (e.g., with NiPdAu). The depicted lead frame 100 includes a plurality of interior electrical contacts 106, 109 and a plurality of exterior electrical contacts 110 that are connected to a dam bar 108 which is provided around the perimeter of lead frame 100.

As will be appreciated, portions of the dam bar 108 are later removed (i.e., trimmed) from lead frame 100 during device processing to physically separate and electrically isolate adjacent electrical contacts 106/109, 110. The depicted lead frame 100 also includes a die attach flag 104 that may be connected to the frame around the periphery and/or to the dam bar 108. As shown, the die attach flag 104 is recessed below the remainder of the lead frame and attached thereto by a tie bar 105, though this is not required in all embodiments.

The die attach flag 104 is configured to support an integrated circuit (IC) die or device, such as an application specific integrated circuit (ASIC). In particular and as shown in FIG. 1, the intended location of an IC die is indicated with the dashed lines 112. Though not shown, it will be appreciated that multiple die flags may be included in a lead frame, each supporting a separate IC die.

Figure 2:
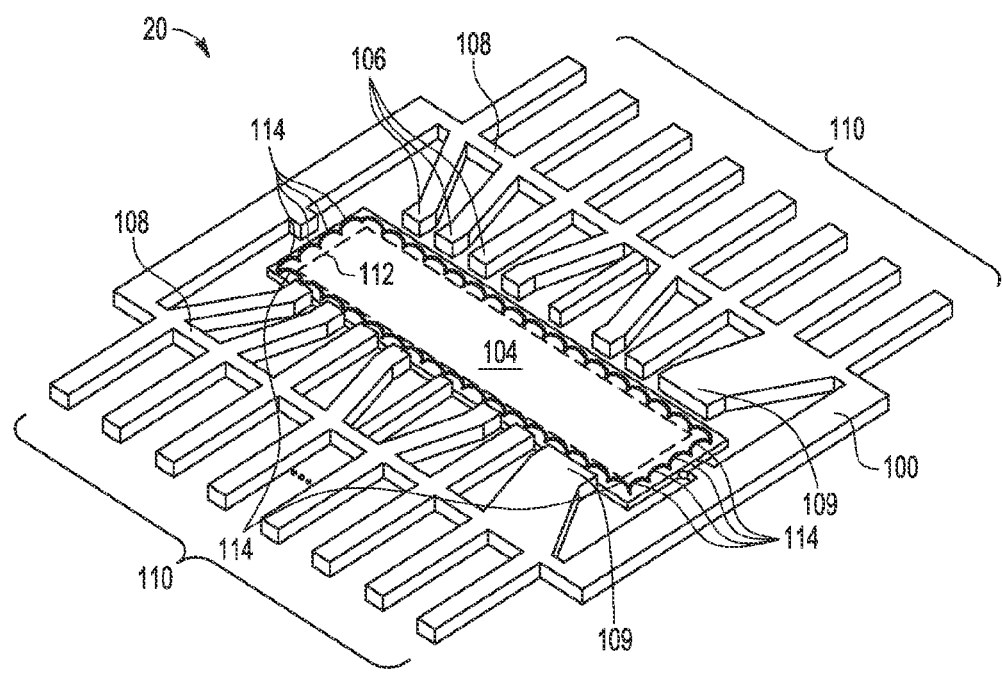
FIG. 2 is an isometric top view of a lead frame assembly having a plurality of wire wedge bond loops formed around the periphery of the die flag.

Turning now to FIG. 2, there is illustrated processing of the lead frame 100 subsequent to FIG. 1 with an isometric top view 20 of a lead frame assembly having a plurality of wire wedge bond loops 114 formed around the periphery of the die flag 104 so as to be located outside the intended IC die location 112. In selected embodiments, the wire wedge bond loops 114 may be formed as a continuous string of wire which is bonded to the die flag 104 at different locations to form a chain of wire bond loops. In other embodiments, the wire wedge bond loops 114 may be formed with one or more separate wire wedge bond loops, or lengths of two or more loops formed where desired. For example, the wire wedge bond loops 114 may be formed by stitch-bonding aluminum wire. Suitable materials for use in forming the wire wedge bond loops 114 includes, but is not limited to aluminum, copper, or gold wires, though other materials may also be used that are bondable to the underlying die flag 104, or other desired metal surface. As formed, the wire wedge bond loops 114 are formed on the die flag 104 as raised (not etched, stamped, or recessed) mechanical locking features to prevent delamination between the die flag 104 and subsequently formed mold compound, thereby preventing declamination cracks from forming therebetween that can propagate to the die and then penetrating under the die. Depending on the material used to form the wire wedge bond loops 114, the areas of the die flag 104 to be bonded should have a bondable surface, such as Ag, or Ni/Pd/Au, or other surface finishes know to promote reliable wire bonding. As illustrated, the wedge bond loop segment(s) or chains may be formed and positioned on the die flag 104 to be close to the die edge so that the IC die may be attached to the die flag 104 at the intended IC die location 112.

Figure 3:
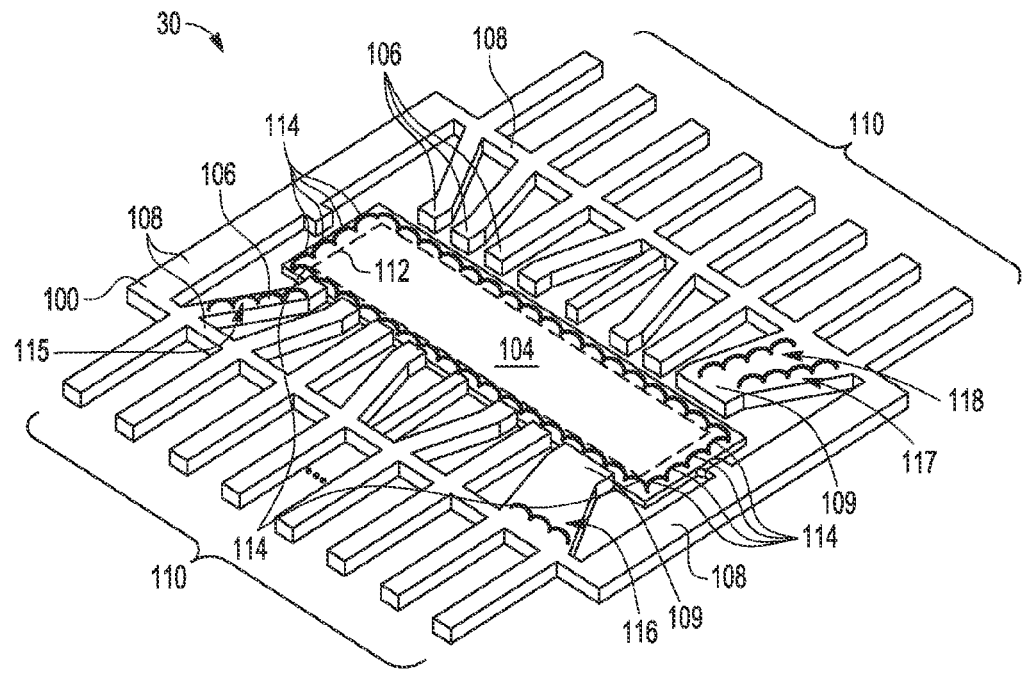
FIG. 3 is an isometric top view of a lead frame assembly having a plurality of wire wedge bond loops formed at one or more predetermined locations on the lead frame and die flag.

In addition or in the alternative to forming the wire bond locks near the intended IC die location 112, it will be appreciated that one or more wire wedge bond loop segments may also be formed on other lead frame surface areas that often show delamination. Examples of such locations are shown in FIG. 3 which provides an isometric top view 30 of a lead frame assembly having a plurality of wire wedge bond loops 114-118 formed at one or more predetermined locations on the lead frame 100 and die flag 104. As a first example, one or more wire wedge bond loops 115 may be formed along one of the interior electrical contacts 106 to prevent delamination at these locations. In other examples, one or more wire wedge bond loops 116, 117, 118 may be formed at a larger contact pin, such as one of the larger silver plated areas 109 to prevent delamination at these locations. As seen from the foregoing, selected embodiments may also be implemented with substrate-based packages, such as ball grid array (BGA) packages where large metal areas are exposed before molding.

To avoid possible contamination of the die flag 104 caused by the die attach process, the wire wedge bond loops 114-118 may be formed prior to die attach. However, it will also be appreciated that the wire wedge bond loops 114-118 may be formed on the die flag 104 after die attach, thereby avoiding a special process flow.

Figure 4:
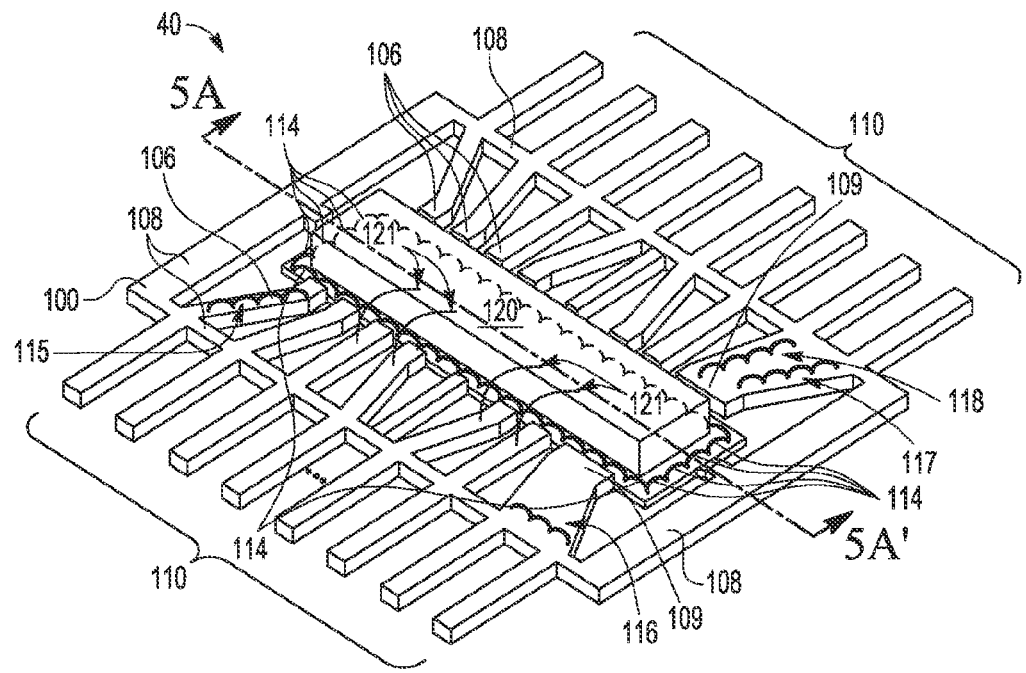
FIG. 4 is an isometric top view of an example lead frame having an integrated circuit die affixed to the die flag.

Turning now to FIG. 4, there is illustrated processing of the lead frame 100 subsequent to FIG. 3 with an isometric top view 40 of a lead frame assembly having an integrated circuit die 120 affixed to the die flag 104. Any desired die bonding may be used to secure the IC die 120 to the die attach flag 104 with a suitable bonding material (e.g., epoxy, glass, gold preform, solder paste, etc.). After being secured to flag 104, the IC die 120 is wire bonded to a selected group of interior electrical contacts 106 with, for example, segments of gold wire 121.

Figure 5:
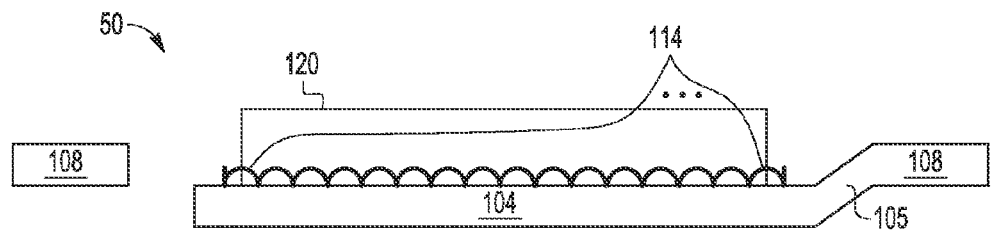
FIG. 5 is a cross-sectional view of the plurality of wire wedge bond loops located along view line 5A-5B in FIG. 4.

Turning now to FIG. 5, there is illustrated a cross-sectional view 50 of the plurality of wire wedge bond loops 114 located along view line 5A-5B in FIG. 4. When forming the mechanical mold locking feature with wire wedge bond loops 114, it will be appreciated that the shape of the wire bond loops provides an excellent profile or contour shape enabling the mold compound locking function. For example, formation of the wire wedge bond loops 114 as aluminum wire loops provides a low loop height and allows the mold compound to flow under the loops for secure locking. However, other raised structures may be used to form the mechanical mold locking feature on the die flag 104 where such structures include lateral protrusions or extensions for mechanically locking with the mold compound.

Figure 6:
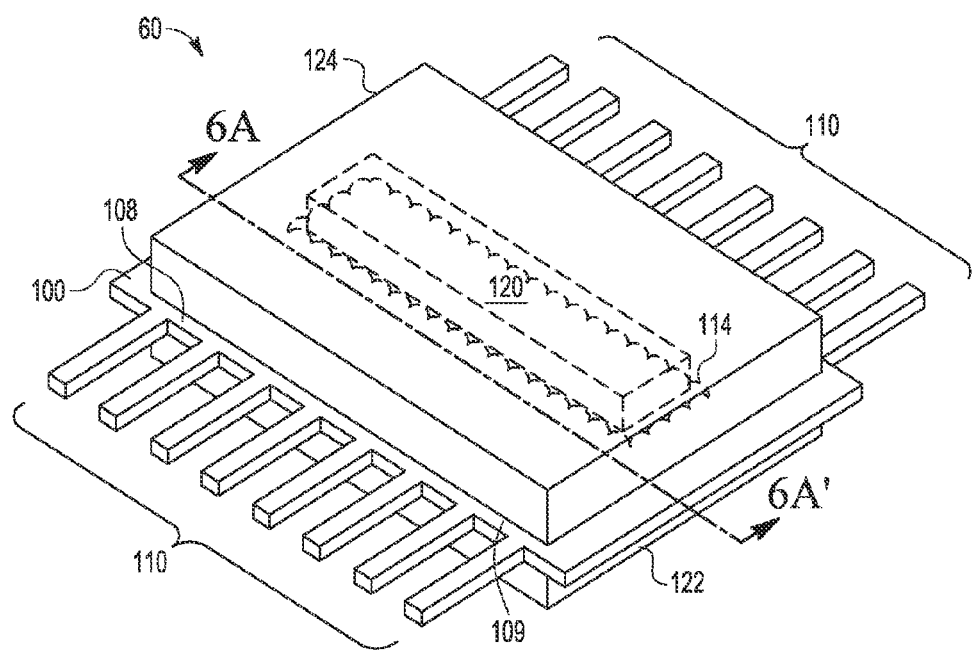
FIG. 6 is an isometric top view of a lead frame assembly after encapsulation of the wire wedge bond loops and integrated circuit die with a mold compound.

Turning now to FIG. 6, there is illustrated processing of the lead frame 100 subsequent to FIG. 4 with an isometric top view 60 of an encapsulated device in which the lead frame 100, integrated circuit die 120, wire wedge bond loops 114, and wire bonds 121 (not shown) are encapsulated with a molding compound 124. Though wire wedge bond loops 115-118 are not shown, it will be appreciated that such structures may also be covered and encapsulated by the molding compound 124. In particular, after the integrated circuit die 120 has been die bonded to flag 104 and wire bonded to selected ones of interior electrical contacts 106, the assembled lead frame 100 and wire bonded die 120 may be encapsulated (e.g., with an over-molded or transfer molded with a composite material (e.g., plastic with a particulate filler material, such as fused silica) to create a molded body 122, 124. As formed, the top of the IC die 120 will be covered with the molding compound 124 and thereby protected from the environment. In addition, the exterior electrical contacts 110 may be bent and the dam bar 108 trimmed as part of the package processing.

Figure 7:
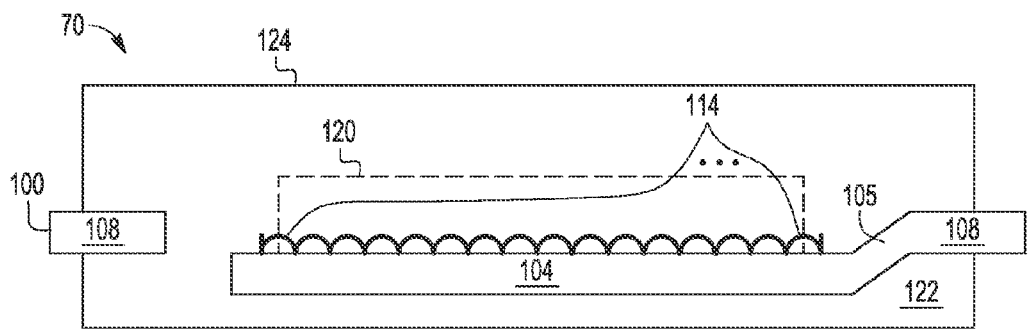
FIG. 7 is a cross-sectional view of the encapsulated wire wedge bond loops and integrated circuit die located along view line 7A-7B in FIG. 6.

Turning now to FIG. 7, there is illustrated a cross-sectional view 70 of the encapsulated wire wedge bond loops 114 and integrated circuit die 120 located along view line 6A-6B in FIG. 6. With mold compound 124 totally enveloping the wedge bond wire loops 114, the wire bond loop features provide excellent and almost continuous (with chain stitch bond wire lengths) locking to the mold compound 124. In selected embodiments, the mold compound 124 may contain aluminum adhesion promoters to promote chemical bonding to the aluminum wire loops 114, further improving mold locking. In selected embodiments where aluminum wires are used to form the wire loops 114, the aluminum wires may have large diameters, where the large diameter structures of such aluminum wire loops provide enhanced strength for the mold compound lock function. For example, wire pull breaks on the 15 mil Al wire stitch bonds require a pull load of over 1000 g. In other embodiments, small diameter aluminum wires may also be used.

As described herein, the wire wedge bond loop structures provide a strong mechanical mold locking feature that extends above the die flag. In contrast to conventional approaches which use etched, stamped, or recessed features in the lead frame/die flag, the wire wedge bond loop structures described herein provide a laterally protruding element to enable the locking engagement with the mold compound. However, it will be appreciated that other types of protruding mold lock features may be used to engage with the mold compound. For example, reference is now made to FIG. 8 which illustrates processing of the lead frame 100 subsequent to FIG. 1 with an isometric top view 80 of a lead frame assembly having a plurality of stud bumps 214-215 formed at one or more predetermined locations on the lead frame 100 and die flag 104. In a first example embodiment, the stud bumps 214 are formed around the periphery of the die flag 104 so as to be located outside the intended IC die location 112. In other example embodiments, the stud bumps 215 are formed as a fence around a down bond location (e.g., at a larger contact pin 109) that lifts due to delamination around the power die due to solder flux residue. Wherever located, the stud bumps 214-215 may be formed as wire bond stud bumps that are bonded to the die flag 104 at different locations. In other embodiments, the stud bumps 214-215 may be formed with gold or copper ball bonds using conventional ball bonding processes in which a combination of heat, pressure and ultrasonic energy are applied form an intermetallic connection or weld between a wire and a connection pad or bonding site on the lead frame 100. Suitable materials for use in forming the stud bumps 214-215 include, but are not limited to silver, aluminum, copper, or gold, though any other bond wire bump material may also be used that is bondable to the underlying die flag 104. It is understood that the stud bumps may not have the idealized shape as stud bumps 214. For example, an aluminum stud would be formed by breaking the aluminum wire in the region immediately adjacent to the wedge bond, leaving a roughly rectangular-shaped aluminum stud. As formed, the stud bumps 214-215 are formed on the die flag 104 as raised (not etched, stamped, or recessed) mechanical locking features to prevent delamination between the die flag 104 and subsequently formed mold compound, thereby preventing delamination cracks from forming therebetween that can propagate to the die and then penetrating under the die.

Figure 8:
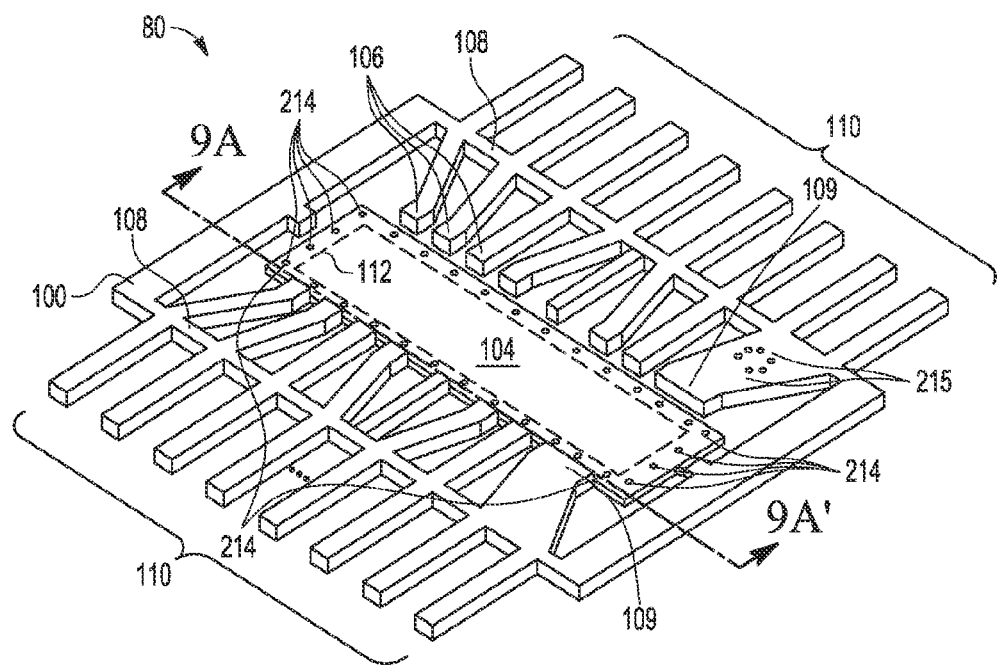
FIG. 8 is an isometric top view of a lead frame assembly having a plurality of stud bumps formed at one or more predetermined locations on the lead frame and die flag.
Figure 9:
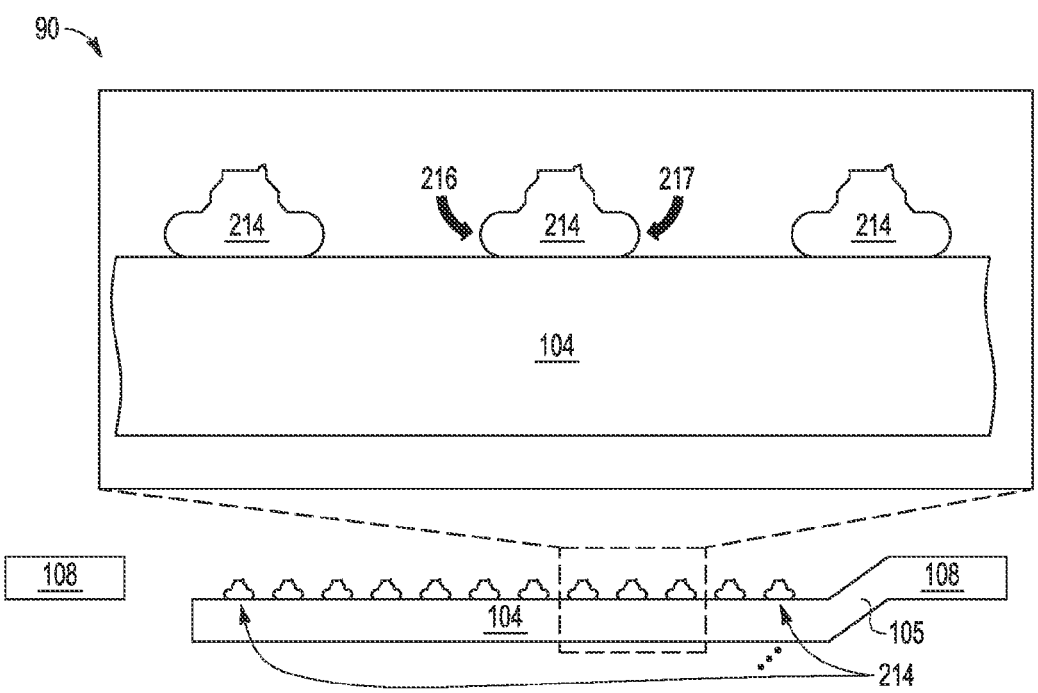
FIG. 9 is a cross-sectional and enlarged view of the encapsulated stud bumps located along view line 9A-9B in FIG. 8.

Turning now to FIG. 9, there is illustrated a cross-sectional view 90 of the plurality of stud bumps 214 located along view line 9A-9B in FIG. 8. When forming the mechanical mold locking feature with stud bumps 214, it will be appreciated that the shape of the stud bumps 214 should provide a laterally protruding profile or contour enabling the mold compound locking function. For example and as illustrated with the enlarged view, formation of the stud bumps 214 as copper or gold wire bond stud bumps on the die flag 104 provides a low stud height and allows the mold compound to flow under the convex-shaped periphery 216, 217 of each stud bump 214. Raised above the surface of the lead frame 104, the surfaces of the stud bumps 214 provide mold compound locking benefits as a combination of any surface adhesion (especially where mold compounds contain adhesion promoters to promote chemical bonding to the stud bump surface) and as structural connection due to the mold compound penetrating under the periphery 216, 217 of the ball bonds 214 where it overhangs the surface of the underlying substrate (e.g., die flag, bond pad, lead frame, etc.).

Figure 10:
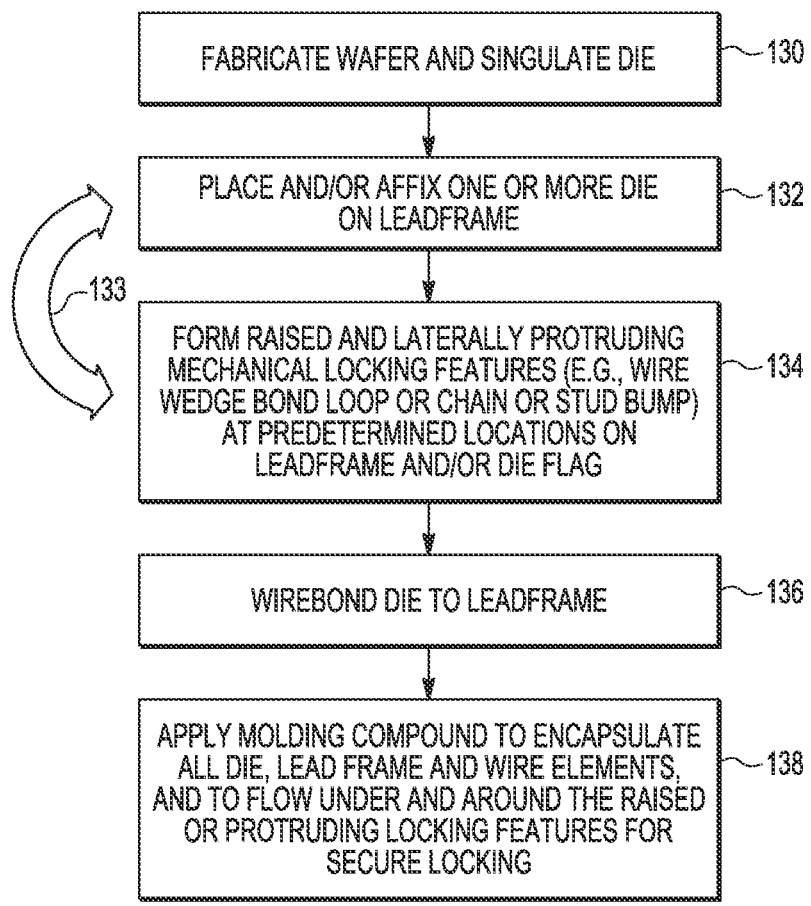
FIG. 10 illustrates an example flow chart depicting a process of fabricating a lead frame assembly and integrated circuit with an encapsulation mold compound package in accordance with selected embodiments of the present invention.

FIG. 10 illustrates an example flow chart depicting a process of fabricating a lead frame assembly and integrated circuit with a mold compound encapsulant package having protruding mold lock structures in accordance with selected embodiments of the present invention. The process begins at step 130 with the fabrication of a wafer using any desired semiconductor fabrication sequence. At a minimum, the wafer is formed to include a plurality of integrated circuit die, typically having identical circuitry. At this stage, additional wafers may be fabricated with different integrated circuit die (e.g., power circuit die). At this step, each wafer is singulated into one or more integrated circuit dice.

At step 132, each integrated circuit die is placed on a lead frame structure which includes a die flag. The die flag may be configured in recessed relation to the remainder of the lead frame structure. At this step, a plurality of integrated circuit die may be aligned and affixed to the lead frame structure.

At step 134, the mold lock structures are formed on the lead frame and/or die flag die. As formed, the mold lock structures are raised (not half-etched) mechanical locking features which protrude laterally over the die flag or lead frame elements at predetermined locations. In selected embodiments, the mold lock features are formed as one or more wire wedge bond loops or chains using an aluminum, copper, silver or gold wire bonding process to form the loop or chain features on the die flag or lead frame elements. In other embodiments, the mold lock features are formed as one or more aluminum, copper, silver, or gold ball bond studs, or wedge bond studs, using an aluminum, copper, silver or gold wire bonding process to form the stud bumps on the die flag or lead frame elements, such as by thermosonically or ultrasonically bonding electrical bond wires to the internal electrical leads or die flag(s) before cutting or pulling the wires away.

In the sequence shown in FIG. 10, the mold lock structures are formed at step 134 after the die attach step 132. This allows the mold lock structure formation step 134 and wire bonding step 136 to occur together, thereby avoiding a special process of forming the mold lock structures before die attach, though this sequence is also possible (as indicated with the switching arrow 133). By forming the mold lock structures prior to die attach, die attach contamination at the die flag where the mold lock structures are formed can be avoided.

At step 136, the integrated circuit die is electrically connected to the internal lead frame elements, such as by using a wire bonding process to connect the bond pads of the integrated circuit die to the internal electrical leads in the lead frame. In selected embodiments, the electrical bond wires are thermosonically bonded to the internal electrical leads and to the bond pads on the integrated circuit die, while in other embodiments the bond wires are connected ultrasonically.

At step 138, a molding compound is applied to surround and protect the die. As formed, the cross-section shape of the wire bond locks will provide a raised and laterally protruding structural contour for secure mold compound locking. For example, aluminum wire loops provide a lateral structural loop height structure, and the aluminum wedge bond region provides a convex-shaped periphery under which the mold compound flows for secure locking. In addition or in the alternative, stud bump locks will provide a lateral contour for mold compound locking so that the mold compound flows under a convex-shaped periphery of each stud bump. Wedge bond loop segments and/or stud bumps may also be formed on other lead frame surface areas that often show delamination, such as large silver plated areas. In addition, the molding compound covers the electrical leads, bond pads, and bond wires at the topside surface of the die, thereby preventing corrosive materials or fluids from reaching the sensitive portions of the integrated circuit die. In addition, the added surface area provided by the aluminum wedge bond loops, and by the stud bumps, provides increased adhesion of the mold compound, particularly when the mold compound is formulated with adhesion promoters for the metal used to form the wedge bond loops or stud bumps.

By now, it should be appreciated that there has been provided herein a microchip structure and associated method for fabrication. The disclosed microchip structure includes a substrate structure and a first chip (e.g., a power integrated circuit die) affixed thereto, such as by using solder die attach. The substrate structure may include, in selected embodiments, a die flag portion of a lead frame structure having a plurality of lead frame elements which form electrical connectors. In addition, the microchip structure includes a mold lock affixed to and laterally protruding above the substrate structure. In selected embodiments, the mold lock may be formed with one or more wire wedge bond loops or chains formed on the substrate structure as raised mechanical locking features to prevent delamination between the molded body and the substrate structure. In other embodiments, the mold lock may be formed with one or more stud bumps formed on the substrate structure as raised mechanical locking features to prevent delamination between the molded body and the substrate structure. In other embodiments, the mold lock is formed with one or more dummy wire bond loops attached to a lead frame element of the substrate structure. In other embodiments, the mold lock is formed with one or more wedge-to-wedge loops attached to the substrate structure and not to the first chip. The mold lock may also be formed as a plurality of mold lock structures which are positioned peripherally around a die flag or on one or more interior electrical contact leads or on a tie bar of the substrate structure, and/or as a plurality of mold lock structures which are positioned as a fence around a down bond region. Finally, the microchip structure includes a molded body formed at least partially around the first chip and around the mold lock to prevent delamination between the mold body and the substrate structure. In selected embodiments, the molded body is a QFN (Quad Flat No leads), SOIC (Small-Outline Integrated Circuit), QFP (Quad Flat Package), BGA (Ball Grid Array), LGA (Land Grid Array), PQFN (Power Quad Flat No leads), TSSOP (Thin Shrink Small Outline Package), PDIP (Plastic Dual In-line Package), or PLCC (Plastic Leaded Chip Carrier) packaging body. The microchip structure may also include or more electrical connectors which are affixed to electrically connect one or more bond pads formed on the first chip to a corresponding lead frame element of the substrate structure which extends through the molded body.

In another form, there is provided a packaged microelectronic device and associated method for packaging same. In the disclosed methodology, a lead frame is provided that has a first die paddle and one or more electrical connector elements. On the lead frame, one or more positive mold lock structures are formed at predetermined locations on a top surface of the lead frame which laterally protrude above the top surface. In selected embodiments, the positive mold lock structures are formed using a wedge bonding process to form one or more wedge-to-wedge loops as dummy features, where the primary function is not an electrical function, on the lead frame. In other embodiments, the positive mold lock structures are formed using a wedge bonding process to form one or more wedge-to-wedge loops on the first die paddle and/or on the one or more electrical connector elements. In other embodiments, the positive mold lock structures are formed as one or more wedge-to-wedge loops which are positioned as a fence around a down bond region. In other embodiments, the positive mold lock structures are formed using a ball bonding process to form one or more stud bumps on the first die paddle or on the one or more electrical connector elements or on a tie bar of the lead frame. In other embodiments, the positive mold lock structures are formed by forming a stud bump by ultrasonically forming a wedge bond with an attached wire component and then breaking off the wire component directly adjacent to the wedge bond, leaving the wedge bond region as the stud bump on the first die paddle or on the one or more electrical connector elements or on a tie bar of the lead frame. In addition, a microelectronic device is mounted onto the lead frame before or after forming the one or more positive mold lock structures. Thereafter, a molded body is formed on at least the top surface of the lead frame to encapsulate the microelectronic device attached to the lead frame and engage with the one or more positive mold lock structures to promote adhesion between the molded body and the lead frame.

In yet another form, there is provided a packaged device and method for making same. As disclosed, the packaged device includes a lead frame substrate with one or more integrated circuit die attached on a first side. The packaged device also includes a plurality of raised wire bond mold lock structures formed on the first side of the lead frame substrate as wedge bond wire loops or stud bumps. In addition, the packaged device includes a molded body which encapsulates the one or more integrated circuit die and mechanically interlocks with the plurality of raised wire bond mold lock structures by flowing around and below over-hanging elements of the raised wire bond mold lock structures to improve adhesion between the molded body and the lead frame substrate.

Various illustrative embodiments of the present invention have been described in detail with reference to the accompanying figures. While various details are set forth in the foregoing description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified drawings of an integrated circuit die and associated packaging without including every device feature or geometry in order to avoid limiting or obscuring the present invention. In addition, certain elements in the figures are illustrated for simplicity and clarity and have not necessarily been drawn to scale. It is also noted that, throughout this detailed description, certain layers of materials will be deposited, removed and otherwise processed to form the depicted integrated circuit die and associated packaging structures. Where the specific procedures for forming such layers are not detailed below, conventional techniques to one skilled in the art for depositing, removing or otherwise forming such layers at appropriate thicknesses shall be intended. Such details are well known and not considered necessary to teach one skilled in the art of how to make or use the present invention.

Although the described exemplary embodiments disclosed herein are directed to various packaged semiconductor devices and methods for making same, the present invention is not necessarily limited to the example embodiments which illustrate inventive aspects of the present invention that are applicable to a wide variety of device packaging processes and/or devices. While the disclosed packaged semiconductor devices may be implemented with one or more power integrated circuits formed on a lead frame assembly, the fabrication process described herein is not limited to any particular integrated circuit arrangement or lead frame connector assembly, but is also applicable to any one of numerous package devices that include an encapsulating material formed to protect integrated circuit die mounted on a die flag. Thus the particular embodiments disclosed above are illustrative only and should not be taken as limitations upon the present invention, as the invention may be modified and practiced in different but equivalent manners apparent to those skilled in the art having the benefit of the teachings herein. For example, the methodology of the present invention may be applied using materials other than expressly set forth herein. In addition, the process steps may be performed in an alternative order than what is presented. For example, the sequence of affixing a die and forming the mechanical locking features may be reversed. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method comprising:
    providing a lead frame comprising a first die paddle and one or more electrical connector elements; and
    forming one or more positive mold lock structures at predetermined locations on a top surface of the lead frame which laterally protrude above the top surface.

2. The method of claim 1, further comprising mounting a microelectronic device onto the lead frame before or after forming the one or more positive mold lock structures.

3. The method of claim 1, further comprising forming a molded body on at least the top surface of the lead frame to encapsulate a microelectronic device attached to the lead frame and engage with the one or more positive mold lock structures to promote adhesion between the molded body and the lead frame.

4. The method of claim 1, where forming one or more positive mold lock structures comprises using a wedge bonding process to form one or more wedge-to-wedge loops as dummy features on the lead frame.

5. The method of claim 1, where forming one or more positive mold lock structures comprises using a wedge bonding process to form one or more wedge-to-wedge loops on the first die paddle.

6. The method of claim 1, where forming one or more positive mold lock structures comprises using a wedge bonding process to form one or more wedge-to-wedge loops on the one or more electrical connector elements.

7. The method of claim 1, where forming one or more positive mold lock structures comprises forming one or more wedge-to-wedge loops which are positioned as a fence around a down bond region.

8. The method of claim 1, where forming one or more positive mold lock structures comprises using a ball bonding process to form one or more stud bumps on the first die paddle or on the one or more electrical connector elements or on a tie bar of the lead frame.

9. The method of claim 1, where forming one or more positive mold lock structures comprises forming a stud bump by ultrasonically forming a wedge bond with an attached wire component and then breaking off the wire component directly adjacent to the wedge bond, leaving the wedge bond region as the stud bump on the first die paddle or on the one or more electrical connector elements or on a tie bar of the lead frame.

* * * * *